United States Patent
Kim et al.

(10) Patent No.: US 8,552,494 B2
(45) Date of Patent: Oct. 8, 2013

(54) SEMICONDUCTOR DEVICES INCLUDING ELEVATED SOURCE AND DRAIN REGIONS

(75) Inventors: Jin-Bum Kim, Seoul (KR); Young-Pil Kim, Gyeonggi-do (KR); Jung-Yun Won, Gyeonggi-do (KR); Hion-Suck Baik, Chungcheonnam-do (KR); Jun-Ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 12/962,061

(22) Filed: Dec. 7, 2010

(65) Prior Publication Data

US 2011/0073941 A1    Mar. 31, 2011

Related U.S. Application Data

(62) Division of application No. 12/166,575, filed on Jul. 2, 2008, now Pat. No. 7,867,865.

(30) Foreign Application Priority Data

Jul. 2, 2007 (KR) .................................. 2007-66217

(51) Int. Cl.
   *H01L 27/088* (2006.01)
(52) U.S. Cl.
   USPC ............... 257/334; 257/368; 257/E21.431; 257/E27.06; 257/394; 438/300; 438/368; 438/294
(58) Field of Classification Search
   None
   See application file for complete search history.

(56) References Cited

U.S. PATENT DOCUMENTS

| 7,176,109 B2 | 2/2007 | Ping et al. | |
| 2006/0270153 A1* | 11/2006 | Lee | 438/253 |
| 2007/0059889 A1 | 3/2007 | Yoo et al. | |
| 2008/0105930 A1* | 5/2008 | Kim et al. | 257/394 |

FOREIGN PATENT DOCUMENTS

| JP | 2007-088138 | 4/2007 |
| KR | 1020030094742 A | 12/2003 |
| KR | 1020060014672 A | 2/2006 |

OTHER PUBLICATIONS

Notice to Submit Response, JP Application No. 10-2007-0066217, Nov. 29, 2008.

* cited by examiner

*Primary Examiner* — Mamadou Diallo
(74) *Attorney, Agent, or Firm* — Myers Bigel Sibley & Sajovec (57) ABSTRACT

Methods of fabricating semiconductor devices are provided. A substrate having active patterns and isolating layer patterns is prepared. Each of the isolating layer patterns has an upper surface higher than that of each of the active patterns. A spacer layer having a uniform thickness is formed on the substrate. The spacer layer is etched to form a spacer on a sidewall of each of the isolating layer patterns. A gate structure is formed on each of the active patterns. A selective epitaxial growth (SEG) process is performed on the active patterns having the gate structure to form isolated epitaxial layers that have upper surfaces higher than those of the isolating layer patterns, on the active patterns. Related semiconductor devices are also provided.

7 Claims, 12 Drawing Sheets

SEMICONDUCTOR DEVICES INCLUDING ELEVATED SOURCE AND DRAIN REGIONS

CLAIM OF PRIORITY

This application is a divisional of U.S. patent application Ser. No. 12/166,575, filed Jul. 2, 2008 now U.S. Pat. No. 7,867,865, which claims priority to Korean Patent Application No. 2007-66217, filed Jul. 2, 2007, the contents of which are hereby incorporated herein by reference.

FIELD OF THE INVENTION

The present invention relates generally to semiconductor devices and methods of fabricating the same and, more particularly to, semiconductor devices including elevated source/drain regions and a method of fabricating the same.

BACKGROUND OF THE INVENTION

Generally, as semiconductor devices become highly integrated, widths of gate patterns and intervals between the gate patterns are reduced. Thus, technology for precisely and accurately forming small patterns is in demand. In a semiconductor device, a channel region of a transistor may become smaller and a contact resistance between a semiconductor substrate and a contact plug may be increased, because each of the gate patterns narrows in width proportional to shrinkage of a design rule. Thus, capacities of these semiconductor device may be effected.

To address this problem, methods of forming recessed gate structures having enlarged effective channel length and methods of forming elevated source/drain regions using a selective epitaxial growth (SEG) process have been developed. The methods of forming the elevated source/drain regions using the SEG process may improve characteristics of the semiconductor device by forming the source/drain regions in a silicon layer that may be formed by selectively growing silicon from an active region of a silicon substrate. However, in the SEG process, the silicon grows in a lateral direction simultaneously with in a vertical direction.

When the elevated source/drain regions are formed using the SEG process having the above-mentioned characteristic of the silicon growth, the silicon layers growing from the active pattern may be connected to each other. In other words, although the connection of the silicon layers is not generated in a peripheral region of the semiconductor substrate where the interval between the active patterns is wide, the silicon layers on the active patterns in a cell region of the semiconductor substrate where the active patterns are densely arranged may be connected with each other. Thus, there may exist a height limit of the elevated source/drain regions formed in the peripheral region of the semiconductor substrate caused by the densely arranged active patterns in the cell region of the semiconductor substrate. As a result, the characteristics of the transistor may not be improved.

To suppress the selective epitaxial lateral growth of the silicon during the formation of the elevated source/drain regions, methods of forming an isolating layer pattern, which is higher than the active pattern, may be proposed. According to the methods, a sidewall of the isolating layer pattern may be used as a blocking layer for reducing the likelihood that the silicon will grow in the lateral direction so that the silicon layers in the cell region may not be connected to each other. However, the isolating layer pattern on the semiconductor substrate may be partially removed by an ion implantation process and a process for removing a photoresist pattern, both of which are performed before the SEG process. As a result, the sidewall of the isolating layer pattern may not be sufficiently used as the blocking layer.

SUMMARY OF THE INVENTION

Some embodiments of the present invention provide a semiconductor device having a structure where silicon layers formed by a selective epitaxial growth (SEG) process are not connected with each other with minimum loss of an isolating layer pattern. Further embodiments of the present invention provide methods of fabricating the above-mentioned semiconductor device.

Further embodiments of the present invention provide methods of forming a semiconductor device including preparing a substrate having active patterns and isolating layer patterns is prepared. Each of the isolating layer patterns has an upper surface higher than that of each of the active patterns. A spacer layer is formed on the substrate. The spacer layer is etched to form a spacer on a sidewall of each of the isolating layer patterns. A gate structure is formed on each of the active patterns. An SEG process is performed on the active patterns having the gate structure to form isolated epitaxial layers on the active patterns.

In some embodiments of the present invention, the substrate may have a cell region and a peripheral region. An interval between the active patterns in the cell region may be narrower than that between the active patterns in the peripheral region.

In further embodiments of the present invention, a channel region and a well region may be formed in the active patterns by an ion implantation process using the spacer layer as an ion implantation mask.

In still further embodiments of the present invention, the upper surfaces of the isolating layer patterns may be higher by from about 10 Å to about 750 Å than those of the active patterns. The spacer may have a thickness of from about 10 Å to about 700 Å.

In some embodiments of the present invention, the epitaxial layers may be formed by a vapor phase epitaxy process, a molecular beam epitaxy process, and the like, to have a thickness of from about 50 Å to about 800 Å.

In further embodiments of the present invention, impurities may be implanted into the epitaxial layers to form elevated source/drain regions.

In still further embodiments of the present invention, the epitaxial layers may have upper surfaces higher than those of the isolating layer patterns.

In some embodiments of the present invention, elevated source/drain regions may be formed in the epitaxial layers.

Further embodiments of the present invention provide methods of fabricating semiconductor devices including preparing a substrate having active patterns and isolating layer patterns. Each of the isolating layer patterns has an upper surface higher than that of each of the active patterns. A spacer layer is formed on the substrate. The active patterns having the spacer layer are etched to form recesses. A first gate structure having a lower portion in each of the recesses is formed. The spacer layer is etched to form a spacer on a sidewall of each of the isolating layer patterns. Here, the spacer reduces an exposing area of an upper surface of each of the active patterns. An SEG process is performed on exposed portions of the active patterns by the first gate structure and the spacer to form isolated epitaxial layers on the active patterns.

In still further embodiments of the present invention, the epitaxial layers may have upper surfaces higher than those of the isolating layer patterns. Furthermore, the elevated source/drain regions may be formed in the epitaxial layers.

In some embodiments of the present invention, the substrate may include a cell region and a peripheral region. An interval between the active patterns in the cell region may be narrower than that between the active patterns in the peripheral region.

In further embodiments of the present invention, a channel region and a well region may be formed in the active patterns by an ion implantation process using an ion implantation mask and the ion implantation mask may be removed.

In still further embodiments of the present invention, impurities may be implanted into the epitaxial layers to form elevated source/drain regions.

Some embodiments of the present invention provide methods of fabricating semiconductor devices including preparing a substrate having a cell region and a peripheral region where active patterns and isolating layer patterns are formed is prepared. Each of the isolating layer patterns has an upper surface higher than that of each of the active patterns. A spacer layer is formed on the substrate. A first etch stop layer is formed on the peripheral region of the substrate. The active patterns in the cell region are etched to form recesses. A first gate insulating layer is formed on the active patterns exposed through the recesses. A second etch stop layer is formed on the cell region of the substrate. The spacer layer in the peripheral region is etched until upper surfaces of the active patterns are exposed to form a spacer on a sidewall of each of the isolating layer patterns. A second gate insulating layer is formed on the active patterns in the peripheral region. A first gate structure having a lower portion in each of the recesses is formed on the active patterns in the cell region. A second gate structure is formed on the active patterns in the cell region. An SEG process is performed on the active patterns in the cell region and the peripheral region to form isolated epitaxial layers on the active patterns. Here, the epitaxial layers have upper surfaces higher than those of the isolating layer patterns. Furthermore, elevated source/drain regions are formed in the epitaxial layers.

Further embodiments of the present invention provide a semiconductor device including a substrate, isolating layer patterns, a spacer, a gate structure, epitaxial layers and source/drain regions. The isolating layer patterns define active patterns of the substrate. The isolating layer patterns have upper surfaces higher than those of the active patterns. The spacer is formed on the upper surfaces of the active patterns and sidewalls of the isolating layer patterns. The gate structure is formed on the active patterns. The epitaxial layers grow from the active patterns having the gate structure and the spacer by an SEG process. The source/drain regions are formed in the epitaxial layers.

Still further embodiments of the present invention provide a semiconductor device including a substrate, isolating layer patterns, a spacer, a first gate structure, a second gate structure and epitaxial layers. The substrate has a cell region and a peripheral region where active patterns are formed, respectively. An interval between the active patterns in the cell region is narrower than that between the active patterns in the peripheral region. The isolating layer patterns define the active patterns in the cell region and the peripheral region of the substrate. The isolating layer patterns have upper surfaces higher than those of the active patterns. The spacer is formed on the upper surfaces of the active patterns and sidewalls of the isolating layer patterns. The first gate structure is formed on the active patterns. The first gate structure has a lower portion in recesses of the active patterns. The second gate structure is formed on the active patterns in the peripheral region. The second gate structure has a flat structure. The epitaxial layers grow from the active patterns in the cell region and the peripheral region having the first gate structure, the second gate structure and the spacer by an SEG process.

DETAILED DESCRIPTION OF EMBODIMENTS OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third and the like. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
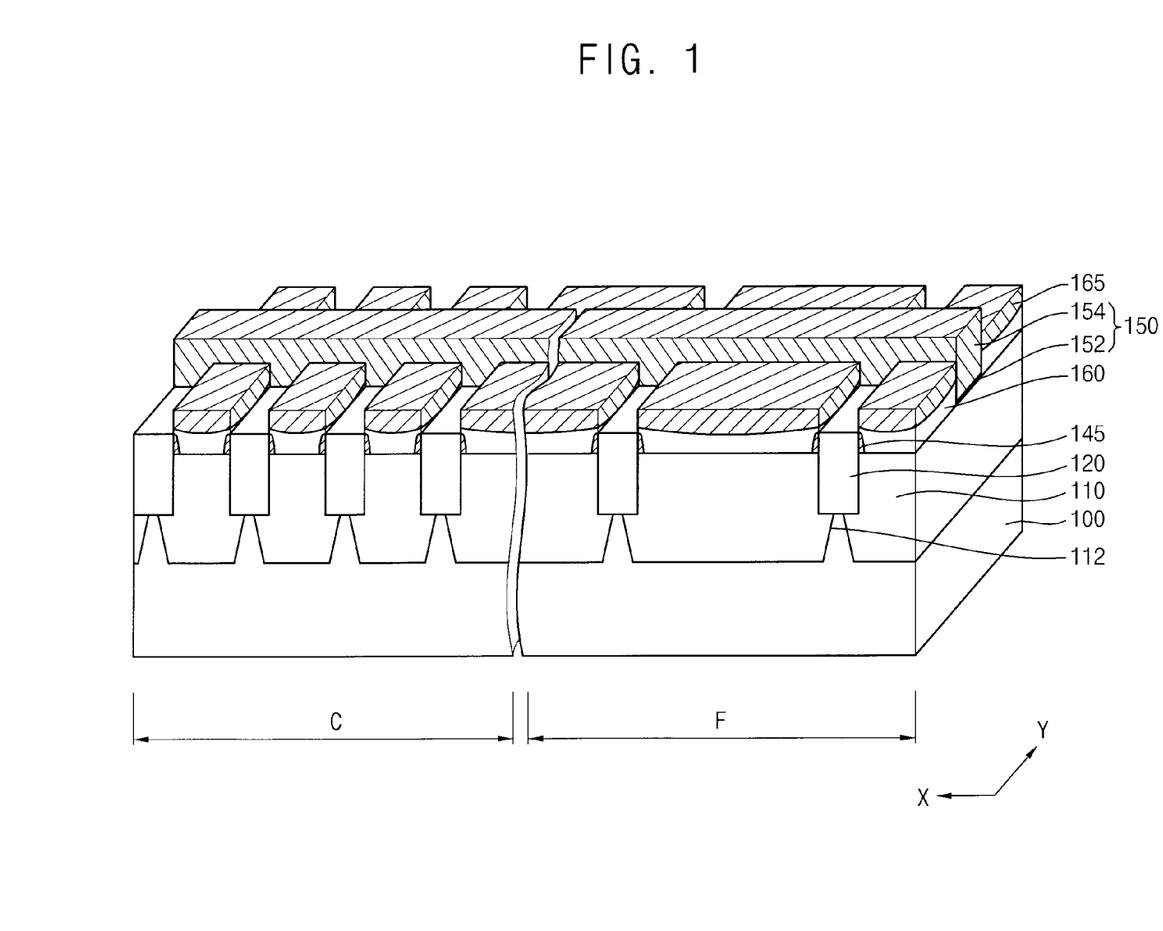
FIG. 1 is a perspective view illustrating semiconductor devices including elevated source/drain regions in accordance with some embodiments of the present invention.

Some embodiments of the present invention will now be discussed herein with respect to FIGS. 1 through 17. Referring first to FIG. 1, a perspective view illustrating semiconductor devices including elevated source/drain regions in accordance with some embodiments of the present invention will be discussed. As illustrated in FIG. 1, a semiconductor device includes a semiconductor substrate 100 having active patterns 110 and isolating layer patterns 120, gate structures 150 formed on the semiconductor substrate 100, spacers 145 formed on sidewalls of the isolating layer patterns 120, epitaxial layers 160 formed on the active patterns 110, and source/drain regions 165 formed in the epitaxial layers 160.

The semiconductor substrate 100 is divided into a cell region C and a peripheral region F. The cell region C of the semiconductor substrate 100 includes the active patterns 110 and the isolating layer patterns 120. The isolating layer patterns 120 in the cell region C have upper surfaces higher than those of the active patterns 110 in the cell region C where the spacers 145 are formed. In some embodiments, the active patterns 110 in the cell region C of the semiconductor substrate 100 may be densely arranged so that a first interval between the active patterns 110 in the cell region C may be very narrow. For example, the upper surfaces of the isolating layer patterns 120 in the cell region C may be higher by from about 10 Å to about 750 Å than those of the active patterns 110 in the cell region C. In some embodiments, the upper surfaces of the isolating layer patterns 120 in the cell region C may be higher by from about 50 Å to about 500 Å than those of the active patterns 110 in the cell region C.

The peripheral region F of the semiconductor substrate 100 includes the active patterns 110. In some embodiments of the present invention, a second interval between the active patterns 110 in the peripheral region F may be wider than the first interval between the active patterns 110 in the cell region C. Furthermore, the isolating layer patterns 120 in the peripheral region F may have upper surfaces higher than those of the active patterns 110 in the peripheral region F. Furthermore, the active patterns 110 in the cell region C and the peripheral region F may include a well region 112 and a channel region (not shown) formed by implanting impurities into the active patterns 110.

The spacers 145 are formed on the sidewalls of the isolating layer patterns 120. The presence of the spacers 145 may reduce the likelihood that the sidewalls of the isolating layer patterns 120 will be damaged. Furthermore, the spacers 145 may reduce exposing areas of the upper surfaces of the active patterns 110. In some embodiments of the present invention, the spacers 145 on the sidewalls of the isolating layer patterns 120 may suppress an epitaxial lateral growth of the epitaxial layers 160 and increase widths of the isolating layer patterns 120 when the epitaxial layers 160 are formed by a selective epitaxial growth (SEG) process. As a result, the epitaxial layers 160 on the active patterns 110 may not be connected with each other. For example, the spacers 145 may have a thickness of from about 10 Å to about 700 Å, or in some embodiments from about 50 Å to about 500 Å.

The epitaxial layers 160 may be formed by the SEG process using the active patterns 110 as a seed layer. In some embodiments of the present invention, the epitaxial layers 160 may have a thickness greater than a step difference between the active patterns 110 and the isolating layer patterns 120. For example, when the step difference is about 100 Å, the epitaxial layers 160 may have a thickness of from about 120 Å to about 300 Å.

The source/drain regions 165 may be formed by doping impurities of high concentration into the epitaxial layers 160. Thus, the source/drain regions 165 on the active patterns 110 may be placed on a plane higher than the upper surfaces of the isolating layer patterns 120.

Each of the gate structures 150 includes a gate insulating layer pattern 152 and a gate electrode 154. In some embodiments, the gate structures 150 may include a first gate structure (not shown) in the cell region C of the semiconductor substrate 100, and a second gate structure (not shown) in the peripheral region F of the semiconductor substrate 100. The first gate structure may include a first gate insulation layer pattern and a first gate electrode. Furthermore, the first gate structure may have a structure having a gate electrode that has a lower portion in a recess of the active patterns 110. In some embodiments of the present invention, the first gate structure may be a flat structure. The second gate structure may include a second gate insulating layer pattern and a second gate electrode.

Figure 2:
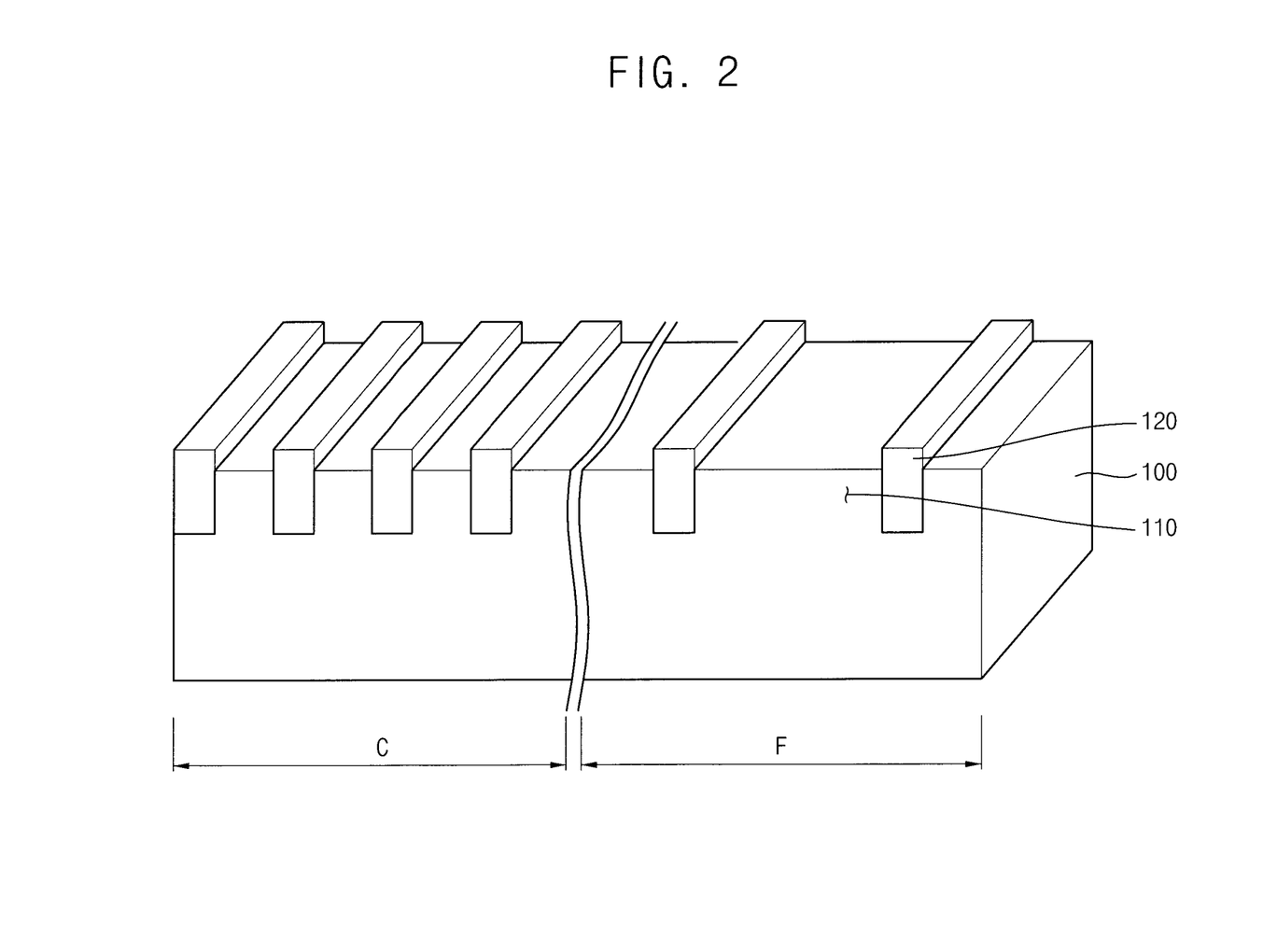
FIGS. 2 through 6 are perspective views illustrating processing steps in the fabrication of the semiconductor devices illustrated in FIG. 1.

Referring now to FIGS. 2 through 6, processing steps in the fabrication of the semiconductor device illustrated in FIG. 1 will be discussed. The same reference numerals refer to the same elements throughout. Accordingly, details with respect to like elements may not be repeated herein. As illustrated in FIG. 2, the semiconductor substrate 100 having the cell region C and the peripheral region F is prepared. The isolating layer patterns 120 are formed in the cell region C and the peripheral region F, respectively, to define the active patterns 110 of the semiconductor substrate 100.

In some embodiments, a pad oxide layer (not shown) may be formed on the semiconductor substrate 100 including silicon. A hard mask (not shown) for defining a region where the isolation layer patterns 120 are to be formed is formed on the pad oxide layer. The hard mask may be formed by forming a nitride layer (not shown) on the pad oxide layer, and by patterning the nitride layer.

The pad oxide layer and the semiconductor substrate 100 exposed by the hard mask are etched to form a trench (not shown) having a depth of about 1,000 Å to about 2,500 Å. The active patterns 110 of the semiconductor substrate 100 may be defined by the formation of the trench. Additionally, a liner layer (not shown) may be formed on the semiconductor substrate 100 exposed through the trench to cure damage to the semiconductor substrate 100 and reduce the likelihood of the formation of a leakage current when the trench is formed.

The hard mask is covered with a silicon oxide layer (not shown) to fill up the trench. In some embodiments, examples of the silicon oxide layer may include a borophosphosilicate glass (BPSG) layer, a phosphosilicate glass (PSG) layer, an undoped silicate glass (USG) layer, a spin-on glass (SOG) layer, a plasma-enhanced tetraethylorthosilicate (PE-TEOS) layer, and the like. The silicon oxide layer is planarized by a chemical mechanical polishing (CMP) process until an upper surface of the hard mask is exposed. The hard mask is removed by a wet etching process using an etching solution that includes phosphorous. As a result, the isolating layer patterns 120 are formed in the trench. The isolation layer patterns 120 may have the upper surfaces higher than those of the active patterns 110. For example, the upper surfaces of the isolating layer patterns 120 may be higher by from about 10 Å to about 750 Å than those of the active patterns 110.

Furthermore, the isolating layer patterns 120 in the cell region C may be relatively densely arranged. In contrast, the isolating layer patterns 120 in the peripheral region F may be relatively sparsely arranged. Particularly, the isolating layer patterns 120 in the cell region C may also narrow in width proportional to shrinkage of a design rule.

Figure 3:
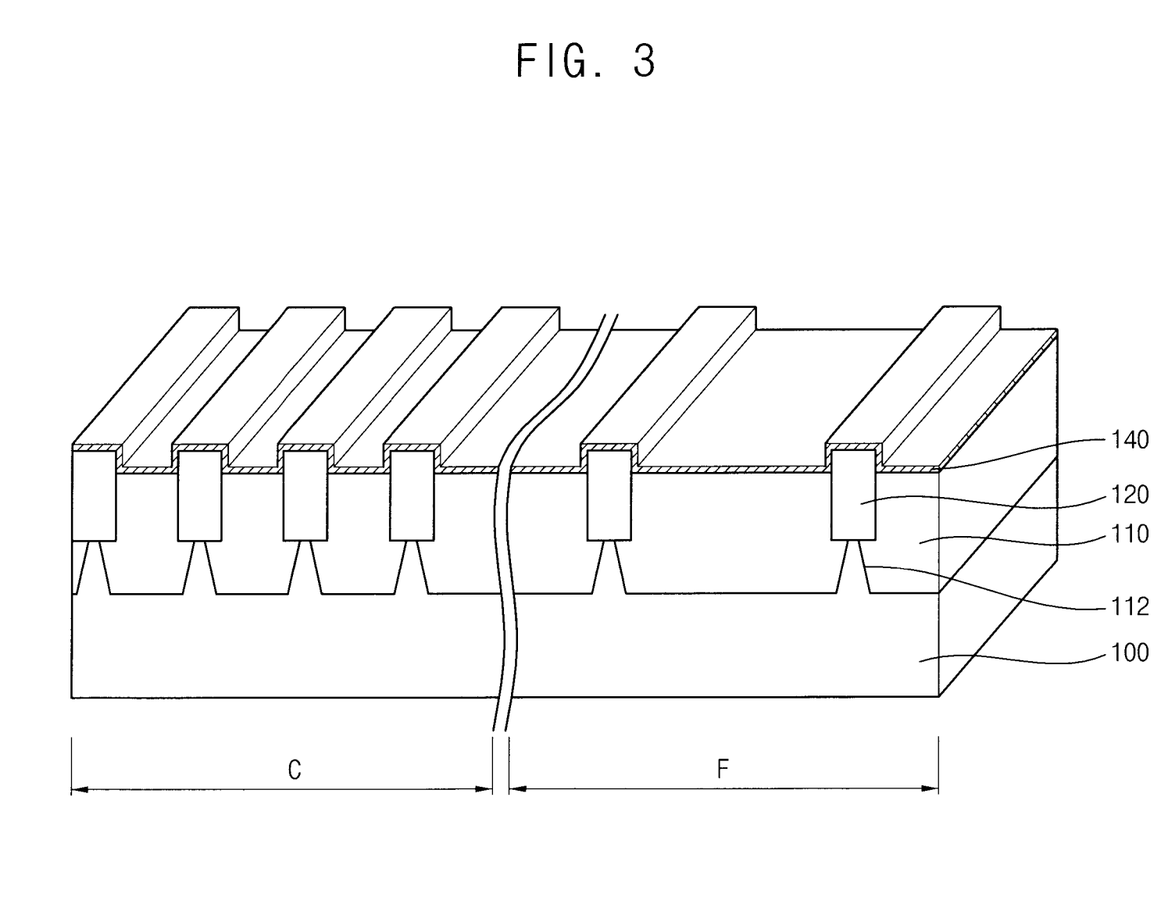

Referring now to FIG. 3, a spacer layer 140 is formed on the active patterns 110 and the isolating layer patterns 120 of the semiconductor substrate 100. In some embodiments, the spacer layer 140 may include silicon nitride, silicon oxynitride, and the like. Furthermore, the spacer layer 140 may have a uniform thickness. For example, the spacer layer 140 may have a thickness of from about 30 Å to about 1,200 Å.

An ion implantation mask (not shown) is formed on the spacer layer 140. Impurities are implanted into the active patterns 110 of the semiconductor substrate 100 using the ion implantation mask to form the well region 112 and the channel region (not shown). In some embodiments, the ion implantation mask may include a photoresist pattern. The ion implantation mask may be removed by an ashing process and/or a stripping process using oxygen plasma after the ion implantation process.

The presence of the spacer layer 140 may reduce the likelihood that damage to the isolating layer patterns 120 will occur in the ion implantation process and the heights of the isolating layer patterns 120 will decrease in the ashing process and/or the stripping process. Furthermore, the spacer layer 140 may be used for forming the spacer that may function as to increase the likelihood of the widths of the isolating layer patterns 120. In particular, the spacer layer 140 may be used as a protective layer of the isolating layer patterns 120 to reduce the possibility that the heights of the isolating layer patterns 120 will decrease. As a result, the sidewalls of the isolating layer patterns 120 may be used as a blocking layer for possibly preventing the lateral growth of the epitaxial layer.

Figure 4:
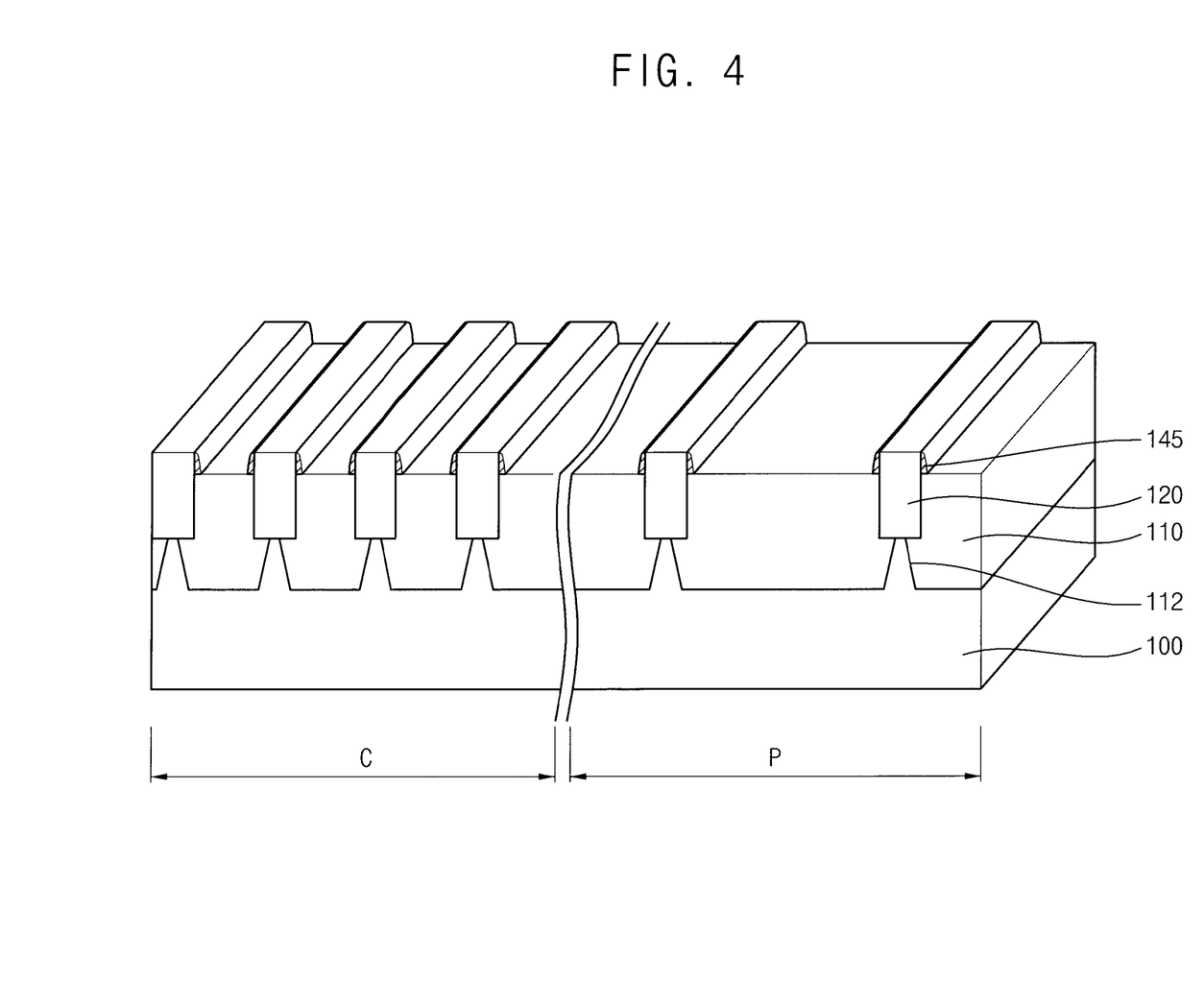

Referring now to FIG. 4, the spacer layer 140 is etched to form the spacers 145 on the upper surfaces of the active patterns 110 and the sidewalls of the isolating layer patterns 120. In some embodiments, the spacer layer 140 may be etched until the upper surfaces of the active patterns 110 are exposed. As a result, the spacers 145 are formed on the upper surfaces of the active patterns 110 in the cell region C and the peripheral region F of the semiconductor substrate 100 and the sidewalls of the isolating layer patterns 120.

The spacers 145 may reduce the likelihood that the sidewalls of the isolating layer patterns 120 will be damaged. Furthermore, the spacers 145 may function as to enlarge the widths of the isolating layer patterns 120 in accordance with the shrinkage of the design rule. Furthermore, the spacers 145 may reduce the exposing areas of the upper surfaces of the active patterns 110 to reduce the likelihood that the epitaxial layers 160 including silicon, which grow from the active patterns 110 by following processes, will be connected with each other. Particularly, since the epitaxial layer 160 may grow in the lateral direction as well as the vertical direction, the spacers 145 may suppress the lateral growth of the epitaxial layers 160 and widen the interval between the isolating layer patterns 120 to possibly prevent the epitaxial layers 160 from being connected with each other.

Figure 5:
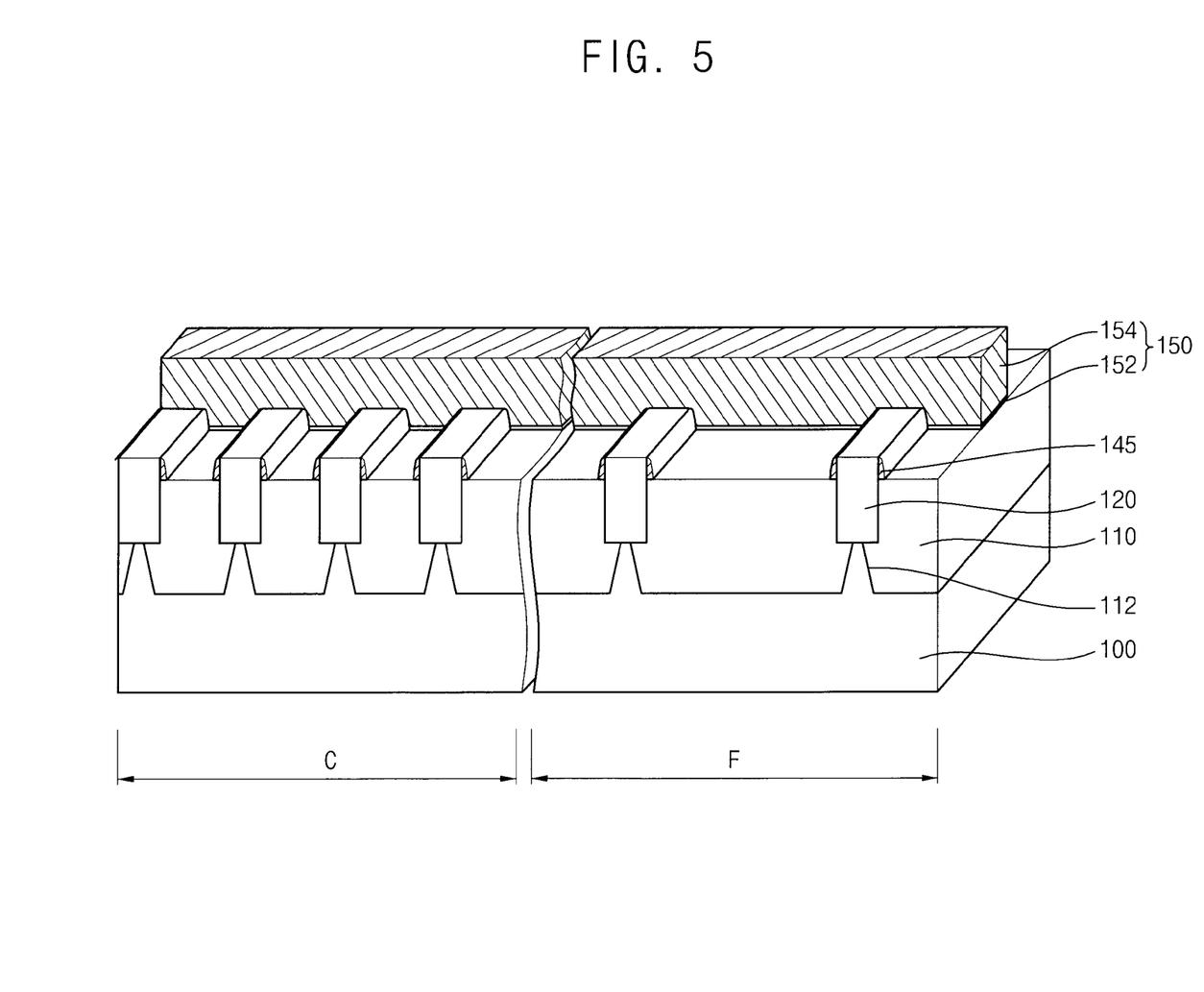

Referring now to FIG. 5, a gate insulating layer (not shown) is formed on the active patterns 110 exposed by the isolating layer patterns 120 having the sidewalls on which the spacers 145 are formed. In some embodiments, the gate insulating layer may be formed by a thermal oxidation process, a chemical vapor deposition (CVD) process, and the like. Here, when the gate insulating layer is formed by the thermal oxidation process, the gate insulating layer may be formed only on the upper surfaces of the active patterns 110.

A gate electrode layer (not shown) is formed on the semiconductor substrate 100 having the gate insulating layer. In some embodiments, the gate electrode layer may include polysilicon doped with impurities, metal, and the like. In particular, the gate electrode layer may include a polysilicon layer doped with $n^+$ type impurities, a dual layer including a polysilicon layer and a metal silicide layer, a dual layer including a polysilicon layer and a metal layer, and the like. For example, the metal silicide layer may include tungsten silicide, titanium silicide, cobalt silicide, tantalum silicide, and the like. The metal layer may include tungsten, titanium, and the like. A gate mask is formed on the gate electrode layer. In some embodiments, the gate mask may be formed by patterning a silicon nitride layer having an etching selectivity higher than the gate electrode layer. The gate electrode layer and the gate insulating layer are sequentially etched using the gate mask as an etching mask to form the gate structures 150 including the gate insulating layer pattern 152, the gate electrode 154 and the gate mask on the semiconductor substrate 100.

In some embodiments, the gate structures 150 may include the first gate structure (not shown) on the cell region C of the semiconductor substrate 100, and a second gate structure (not shown) on the peripheral region F of the semiconductor substrate 100. The first gate structure may include the first gate insulating layer pattern and the first gate electrode. The second gate structure may include the second gate insulating layer pattern and the second gate electrode.

Figure 6:
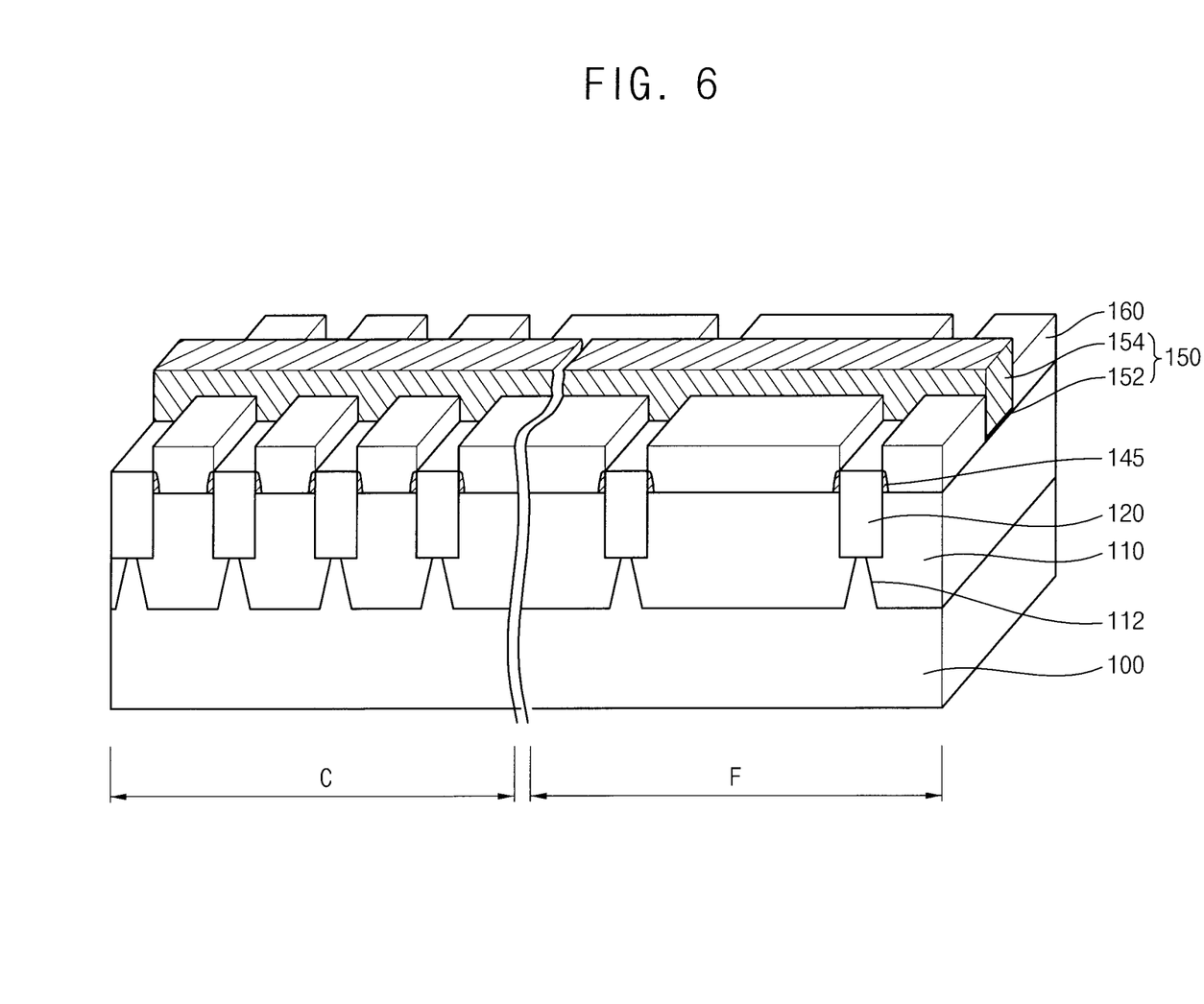

Referring now to FIG. 6, the active patterns 110 of the semiconductor substrate 100 exposed by the gate structures 150, the spacer 145 and the isolating layer patterns 120 are used as a seed layer to form the epitaxial layers 160. In some embodiments, the epitaxial layers 160 may be formed by an SEG process. Examples of the SEG process may include a liquid phase epitaxy process, a vapor phase epitaxy process, a molecular beam epitaxy process, and the like.

In some embodiments, the SEG process includes the vapor phase epitaxy process. The epitaxial layers 160 having a crystalline structure substantially the same as that of the active patterns 110 may be formed from the upper surfaces of the active patterns 110 by the SEG process. Since the active patterns 110 are included in the semiconductor substrate 100 including the silicon, the active patterns 110 may include single crystalline silicon. Furthermore, the epitaxial layers 160 may have a thickness greater than a step difference between the active patterns 110 and the isolating layer pattern 120. For example, when the step difference is about 200 Å, the epitaxial layers 160 may have a thickness of about 300 Å to about 800 Å.

Therefore, the lateral growth of the epitaxial layers 160 formed by the above-mentioned processes may be suppressed due to the spacers 145 and the isolating layer patterns 120. As a result, the epitaxial layers 160 may not be connected with each other.

Impurities of high concentration are implanted into the epitaxial layers 160 using the gate structures 150 and the isolating layer patterns 120 as an ion implantation mask to form the elevated source/drain regions 165, thereby completing the transistor in FIG. 6.

Figure 7:
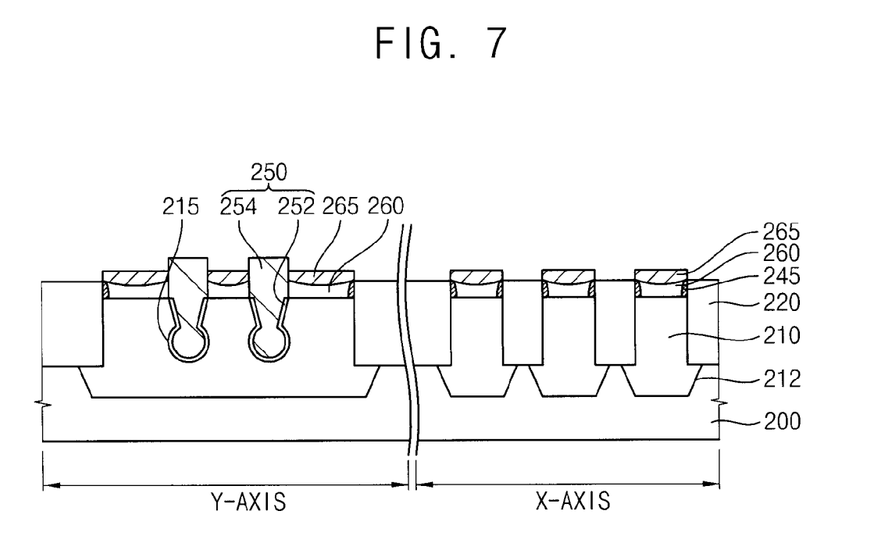
FIG. 7 is a cross-section illustrating semiconductor devices including elevated source/drain regions in accordance with some embodiments of the present invention.

Referring now to FIG. 7, a cross-section illustrating semiconductor devices including elevated source/drain regions in accordance with some embodiments of the present invention will be discussed. As illustrated in FIG. 7, a semiconductor device includes a semiconductor substrate 200 having active patterns 210 and isolating layer patterns 220. The isolating layer patterns 220 define the active patterns 210 of the semiconductor substrate 200. Furthermore, the isolating layer patterns 220 have upper surfaces higher that those of the active patterns 210. A well region 212 and a channel region (not shown) corresponding to impurity regions are formed at upper surfaces of the active patterns 210. Spacers 245 are formed on the upper surfaces of the active patterns 210 and sidewalls of the isolating layer patterns 220. Gate structures 250 are formed on the active patterns 210. Furthermore, each of the gate structures 250 has a lower portion in a recess of each of the active patterns 210. Each of the gate structures 250 includes a gate insulating layer 252 and a gate electrode 254.

Epitaxial layers 260 grown from the upper surfaces of the active patterns 210 where the gate structures 250 and the spacers 245 are formed. Elevated source/drain regions 265 are formed in the epitaxial layers 260 adjacent to the gate insulating layer 252.

Referring now to FIGS. 8 through 11, cross-sections illustrating processing steps in the fabrication of the semiconductor devices illustrated in FIG. 7 will be discussed. Like reference numerals refer to the like elements throughout the specification, thus details with respect to these elements will not be repeated herein. Furthermore, an x-axis represents a direction substantially perpendicular to a lengthwise direction of the gate electrode, and a y-axis indicates a direction substantially in parallel with the lengthwise direction of the gate electrode.

Figure 8:
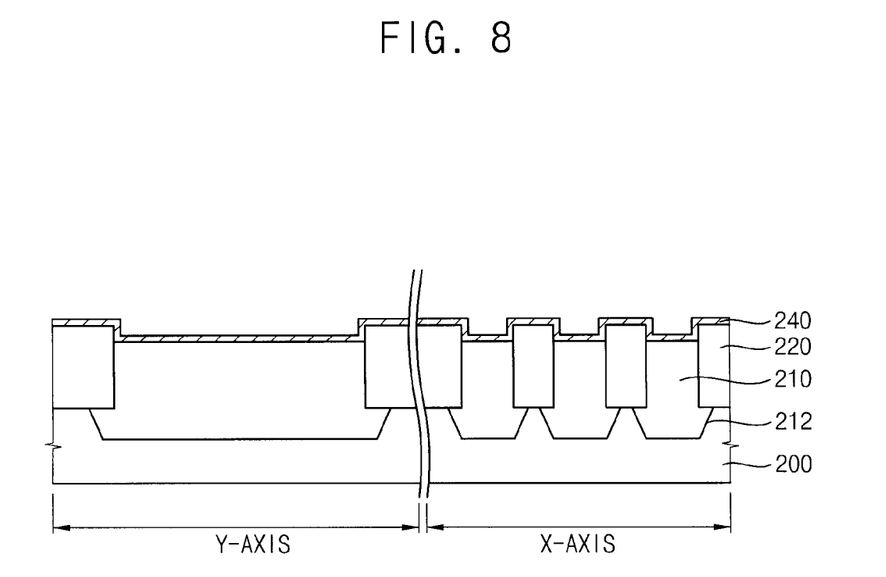
FIGS. 8 through 11 are cross-sections illustrating processing steps in the fabrication of the semiconductor devices illustrated in FIG. 7.

Referring to FIG. 8, the semiconductor substrate 200 having the active patterns 210 and the isolating layer patterns 220 is prepared. In some embodiments, the isolating layer patterns 220 may have upper surfaces higher than those of the active patterns 210. Processes for forming the isolating layer patterns 220, the active patterns 210 and the spacer layer 240 may be substantially similar to those illustrated with reference to FIGS. 2 and 3. Thus, any further illustrations with respect to the same processes are omitted herein for brevity.

An ion implantation mask (not shown) is formed on the spacer layer 240. Impurities are implanted into the upper surfaces of the active patterns 210 using the ion implantation mask to form the well region 212 and the channel region (not shown) corresponding to impurity regions. In some embodiments, the ion implantation mask may include a photoresist pattern. Furthermore, the ion implantation mask may be removed by an ashing process and/or a stripping process using oxygen plasma after the ion implantation process. The spacer layer 240 may possibly prevent damage to the isolating layer patterns 220 in the ion implantation process and the heights of the isolating layer patterns 220 from decreasing in the ashing process and/or the stripping process.

Figure 9:
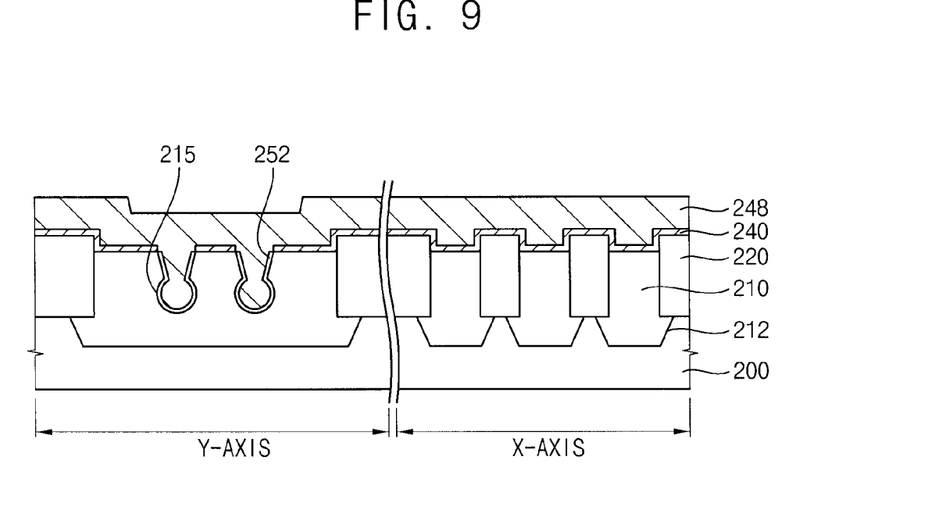

Referring now to FIG. 9, the spacer layer 240 and the active patterns 210 are sequentially etched to form recesses 215 at the upper surfaces of the active patterns 210. In some embodiments, each of the recesses 215 may have an upper width and a lower width narrower than the upper width.

A gate insulating layer (not shown) is formed on the active patterns 210 exposed through the recesses 215. In some embodiments, the gate insulating layer may be formed by a thermal oxidation process, a CVD process, and the like. Here, the gate insulating layer may be formed only on the upper surfaces of the active patterns 210.

A gate electrode layer 248 is then formed on the gate insulating layer to fill up the recesses 215. In some embodiments, the gate electrode layer 248 may include polysilicon doped with impurities, metal, and the like. In particular, the gate electrode layer 248 may include a polysilicon layer doped with n⁺ type impurities, a dual layer including a polysilicon layer and a metal silicide layer, a dual layer including a polysilicon layer and a metal layer, and the like.

Figure 10:
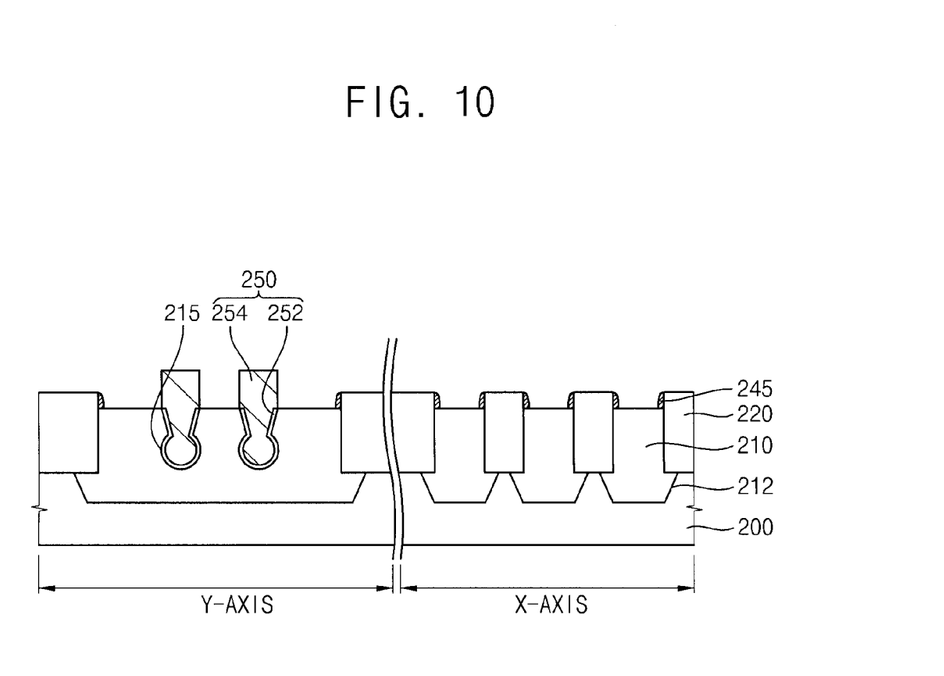

Referring now to FIG. 10, a gate mask (not shown) is formed on the gate electrode layer 248. In some embodiments, the gate mask may be formed by patterning a silicon nitride layer having an etching selectivity higher than that of the gate electrode layer 248. The gate electrode layer 248 and the gate insulating layer are sequentially etched using the gate mask as an etching mask to form the gate structures 250 including the gate insulating layer pattern 252, the gate electrode 254 and the gate mask on the semiconductor substrate 200. Here, the gate electrode 254 may have the lower portion in the recess 215.

The spacer layer 240 exposed by the gate electrode 254 having the lower portion in the recess 215 is etched to form the spacers 245 on the upper surfaces of the active patterns 210 and the sidewalls of the isolating layer patterns 220.

The spacers 245 may function as to enlarge the widths of the isolating layer patterns 220 in accordance with the shrinkage of the design rule. Furthermore, the spacers 245 may reduce the exposing areas of the upper surfaces of the active patterns 210 to prevent the epitaxial layers 260 including silicon, which grow from the active patterns 210 by following processes, from being connected with each other. Particularly, since the epitaxial layer 260 may grow in the lateral direction as well as the vertical direction, the spacers 245 may suppress the lateral growth of the epitaxial layers 260 and widen the interval between the isolating layer patterns 220 to possibly prevent the epitaxial layers 260 from being connected with each other.

Figure 11:
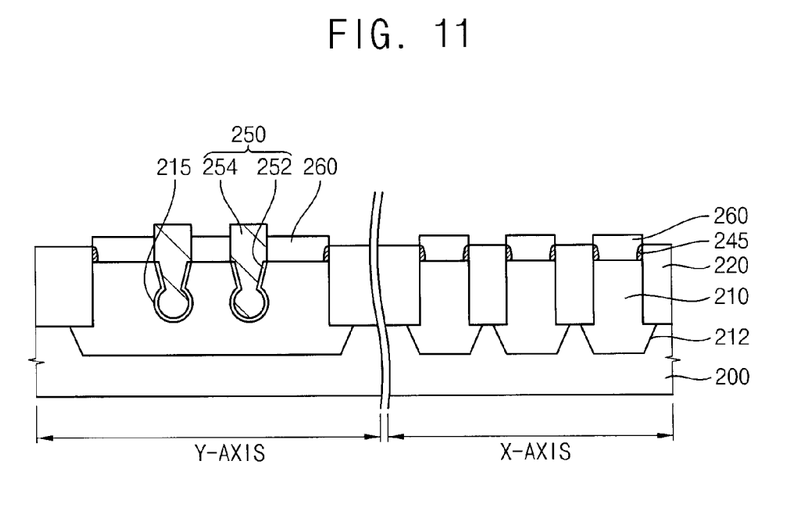

Referring now to FIG. 11, the active patterns 210 of the semiconductor substrate 200 exposed by the gate structures 250 and the spacer 245 are used as a seed layer to form the epitaxial layers 260.

In some embodiments, the epitaxial layers 260 may have a thickness greater than a step difference between the active patterns 210 and the isolating layer pattern 220. For example, when the step difference is about 200 Å, the epitaxial layers 260 may have a thickness of from about 300 Å to about 800 Å. Therefore, the lateral growth of the epitaxial layers 260 formed by the above-mentioned processes may be suppressed due to the spacers 245 and the isolating layer patterns 220. As a result, the epitaxial layers 260 may not be connected with each other.

Impurities of high concentration are implanted into the epitaxial layers 260 using the gate structures 250 and the isolating layer patterns 220 as an ion implantation mask to form the elevated source/drain regions 265, thereby completing the transistor, which includes the gate electrode 254 having the lower portion in the recess 215 and the elevated source/drain regions 265, in FIG. 7.

Figure 12:
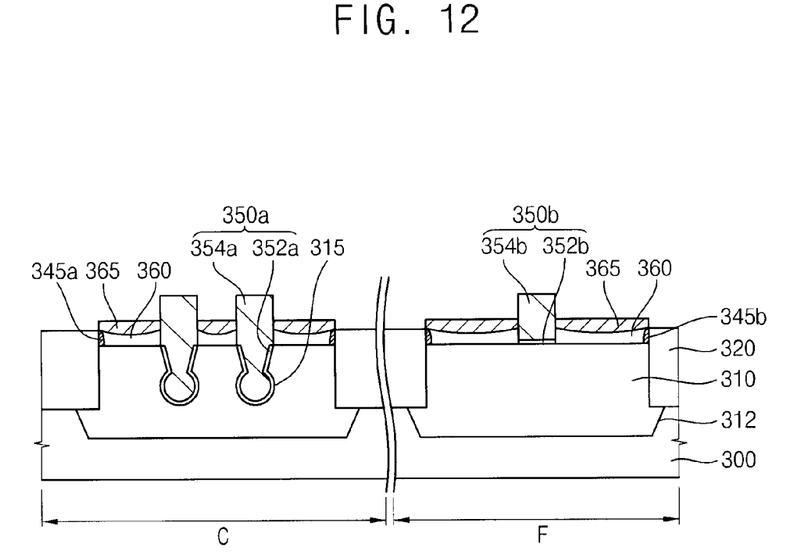
FIG. 12 is a cross-section illustrating semiconductor devices including elevated source/drain regions in accordance with some embodiments of the present invention.

Referring now to FIG. 12, a cross-section illustrating semiconductor devices including elevated source/drain regions in accordance with some embodiments of the present invention will be discussed. As illustrated in FIG. 12, a semiconductor device includes a semiconductor substrate 300 having a cell region C and a peripheral region F. In some embodiments, active patterns 310 and isolating layer patterns 320 may be formed in the cell region C and the peripheral region F, respectively. Furthermore, an interval between the active patterns 310 in the cell region C may be narrower than that between the active patterns 310 in the peripheral region F. The isolating layer patterns 320 define the active patterns 310 of the semiconductor substrate 300. Furthermore, the isolating layer patterns 320 have upper surfaces higher than those of the active patterns 310. A well region 312 and a channel region (not shown) corresponding to impurity regions are formed at upper surfaces of the active patterns 310. Spacers 345 are formed on the upper surfaces of the active patterns 310 and sidewalls of the isolating layer patterns 320. A first gate structure 350a is formed on the active patterns 310 in the cell region C. Furthermore, the first gate structure 350a has a lower portion in a recess 315 of each of the active patterns 310. A second gate structure 350b is formed on the active patterns 310 in the peripheral region F. Furthermore, the second gate structure 350b may have a flat structure. Epitaxial layers 360 grow from the upper surfaces of the active patterns 310 where the first gate structure 350a, the second gate structure 350b and the spacers 345 are formed. Elevated source/drain regions 365 are formed in the epitaxial layers 360 adjacent to the first gate structure 350a and the second gate structure 350b.

Figure 13:
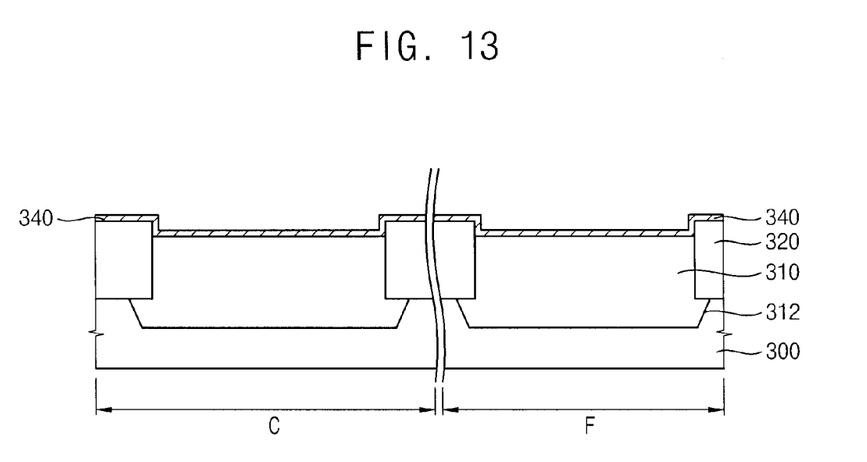
FIGS. 13 through 17 are cross-sections illustrating processing steps in the fabrication of the semiconductor devices illustrated in FIG. 12.

Referring now to FIG. 13 through 17, cross-sections illustrating processing steps in the fabrication of semiconductor devices illustrated in FIG. 12 will be discussed. As illustrated in FIG. 13, the semiconductor substrate 300 having the active patterns 310 and the isolating layer patterns 320 is prepared. In some embodiments, the isolating layer patterns 320 may have upper surfaces higher than those of the active patterns 310. A spacer layer 340 having a uniform thickness is formed on the cell region C and the peripheral region F of the semiconductor substrate 300. Here, processes for forming the isolating layer patterns 320, the active patterns 310 and the spacer layer 340 may be substantially similar to those discussed above with respect to FIGS. 2 and 3. Thus, any further illustrations with respect to the same processes are omitted herein for brevity.

An ion implantation mask (not shown) is formed on the spacer layer 240. Impurities are implanted into the upper surfaces of the active patterns 210 using the ion implantation mask to form the well region 212 and the channel region (not shown) corresponding to impurity regions. In some embodiments, the ion implantation mask may include a photoresist pattern. Furthermore, the ion implantation mask may be removed by an ashing process and/or a stripping process using oxygen plasma after the ion implantation process. The spacer layer 240 may possibly prevent damage to the isolating layer patterns 220 in the ion implantation process and the heights of the isolating layer patterns 220 from decreasing in the ashing process and/or the stripping process.

Figure 14:
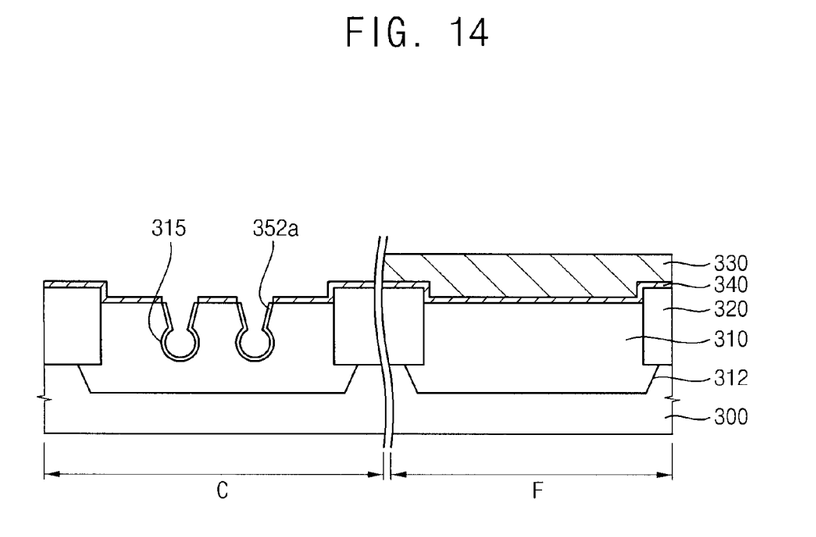

Referring now to FIG. 14, a first etch stop layer 330 is formed on a portion of the spacer layer 340 in the peripheral region F. Here, the first etch stop layer 330 may possibly prevent the portion of the spacer layer 340 in the peripheral region F from being damaged during a following etching process.

The spacer layer 340 and the active patterns 310 in the cell region C are sequentially etched to form recesses 315 at the upper surfaces of the active patterns 310. In some embodiments, each of the recesses 315 may have an upper width and a lower width narrower than the upper width. A gate insulating layer (not shown) is formed on the active patterns 310 exposed through the recesses 315.

Figure 15:
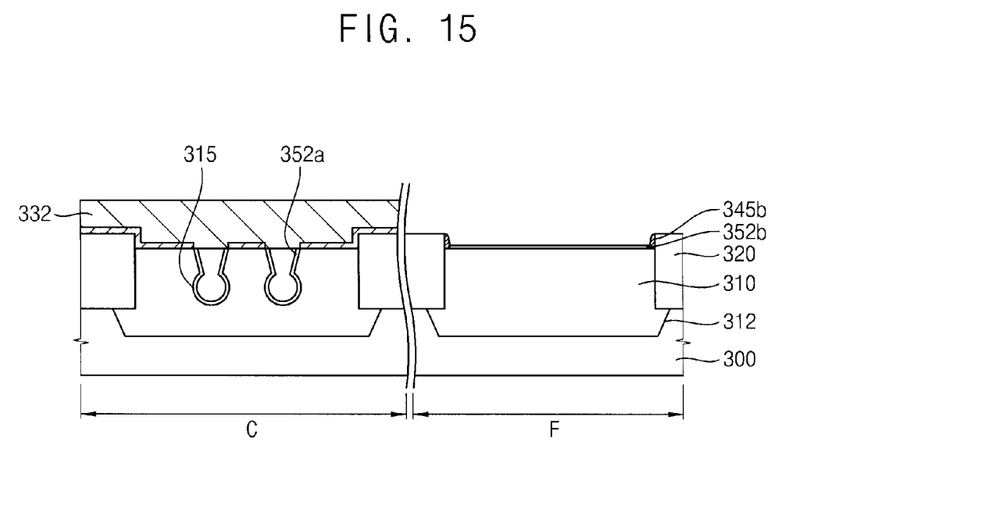

Referring now to FIG. 15, the first etch stop layer 330 in the peripheral region F is then removed. A second etch stop layer 332 is formed on the cell region C. Here, the second etch stop layer 332 may possibly prevent a first gate insulating layer in the cell region C from being damaged during a process for etching the spacer layer 340 in the peripheral region F.

The spacer layer 340 in the peripheral region F is etched until the upper surfaces of the active patterns 320 are exposed to form the spacers 345b on sidewalls of the isolating layer patterns 320 in the peripheral region F and to expose the upper surfaces of the active patterns 310. A second gate insulating layer 352b is then formed on the upper surfaces of the active patterns 310 in the peripheral region F. In some embodiments, the second gate insulating layer 352b may be formed by a thermal oxidation process.

Figure 16:
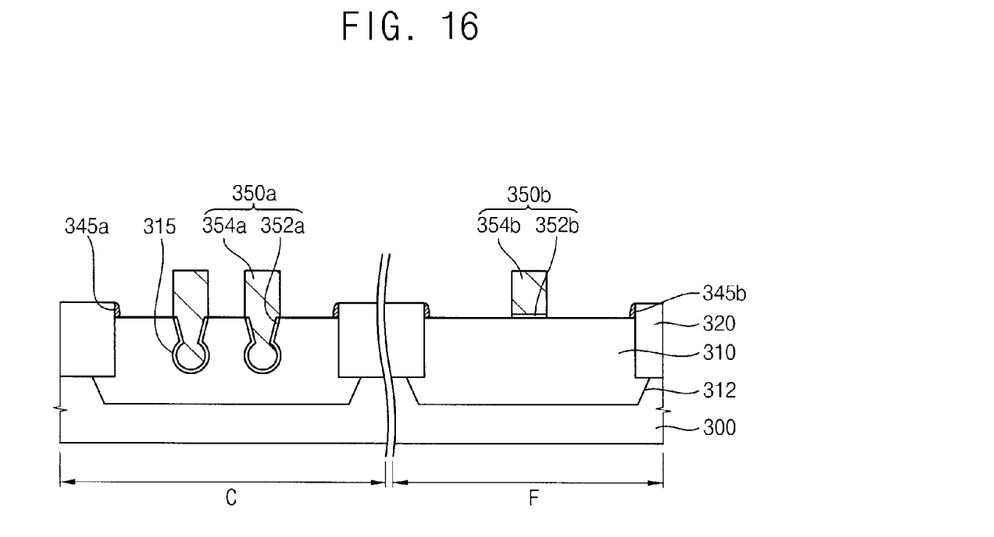

Referring now to FIG. 16, the first gate structure 350a is formed on the active patterns 310 in the cell region C. Furthermore, the second gate structure 350b is also formed on the active patterns 310 in the peripheral region F.

In some embodiments, a gate electrode layer (not shown) may be formed on the active patterns 310 on which the first gate insulating layer and the second gate insulating layer are formed. The gate electrode layer may include polysilicon doped with impurities, metal, and the like. That is, the gate electrode layer may include a polysilicon layer doped with $n^+$ type impurities, a dual layer including a polysilicon layer and a metal silicide layer, a dual layer including a polysilicon layer and a metal layer, and the like. A gate mask (not shown) is formed on the gate electrode layer. The gate electrode layer, the first gate insulating layer and the second gate insulating layer are sequentially etched using the first gate mask as an etching mask to form the first gate structure 350a in the cell region C including the first gate insulating layer pattern 352a, the first gate electrode 354 and a first gate mask, and the second gate structure 350b in the peripheral region F including the second gate insulating layer pattern 352b, the second gate electrode 354b and the second gate mask on the semiconductor substrate 300. Here, the first gate electrode 354a may have the lower portion in the recess 315. Furthermore, the second gate electrode 354b may have a flat structure.

Although not depicted in drawings, gate spacers may be additionally formed on the first gate structure 350a and the second gate structure 350b. By the formation of the gate spacers, the spacer layer 340 in the cell region C may be completely removed, or may partially remain on the sidewalls of the isolation layer patterns 320 to form spacers 345a.

Figure 17:
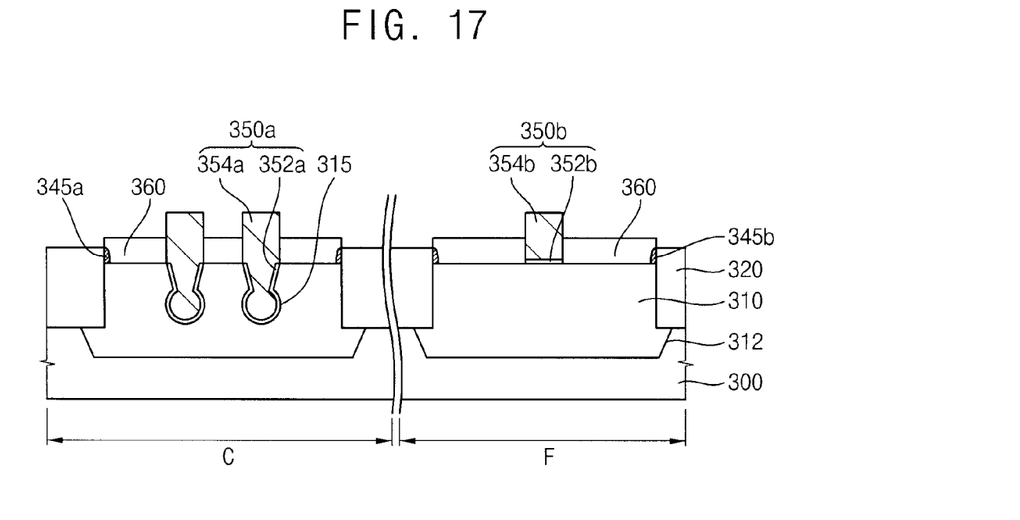

Referring now to FIG. 17, the active patterns 310 of the semiconductor substrate 300 exposed by the first gate structure 350a and the second gate structure 350b are used as a seed layer to form the epitaxial layers 360. In some embodiments, the epitaxial layers 360 may be formed by an SEG process, preferably a vapor epitaxy process. The epitaxial layers 360 may have a thickness greater than a step difference between the active patterns 310 and the isolating layer pattern 320. Therefore, the lateral growth of the epitaxial layers 360 formed by the above-mentioned processes may be suppressed due to the sidewalls of the isolating layer patterns 320. As a result, the epitaxial layers 360 may not be connected with each other.

Impurities of high concentration are implanted into the epitaxial layers 360 using the first gate structure 350a, the second gate structure 350b and the isolating layer patterns 320 as an ion implantation mask to form the elevated source/drain regions 365, thereby completing the transistor, which includes the gate electrode 354 having the lower portion in the recess 315 and the elevated source/drain regions 365, in FIG. 12.

According to some example embodiments of the present invention, the lateral growth of the epitaxial layers may be suppressed owing to the isolating layer patterns. Thus, the epitaxial layers may not be connected with each other.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A semiconductor device comprising:
   a substrate;
   isolating layer patterns formed in the substrate to define active patterns, the isolating layer patterns having upper surfaces higher than those of the active patterns;
   a spacer layer formed on the upper surfaces of the active patterns and sidewalls of the isolating layer patterns;
   a gate structure formed on the active patterns;
   epitaxial layers formed in the active patterns having the gate structure and the spacer; and
   a channel region and a well region in the active patterns,
   wherein the substrate comprises a cell region and a peripheral region and wherein and an interval between the active patterns in the cell region is narrower than an interval between the active patterns in the peripheral region.

2. The semiconductor device of claim 1, wherein the gate structure comprises a gate electrode and a gate insulating layer and wherein the epitaxial layers comprise source/drain regions adjacent to the gate insulating layer.

3. The semiconductor device of claim 1, wherein the active patterns have recesses and wherein the gate structure comprises a gate electrode having a lower portion in the recesses.

4. The semiconductor device of method of claim 1, wherein the upper surfaces of the isolating layer patterns are higher than upper surfaces of the active pattern by from about 10 Å to about 750 Å and wherein the spacer layer has a thickness of from about 10 Å to about 700 Å.

5. The semiconductor device of claim 1, wherein the epitaxial layers by a have a thickness of from about 50 Å to about 800 Å.

6. The method of claim 1, wherein the epitaxial layers have upper surfaces higher than the upper surfaces of the isolating layer patterns.

7. A semiconductor device comprising:
   a substrate having a cell region and a peripheral region where active patterns are formed, respectively, an interval between the active patterns in the cell region being narrower than that between the active patterns in the peripheral region;
   isolating layer patterns formed in the cell region and the peripheral region of the substrate to define the active patterns, the isolating layer patterns having upper surfaces higher than those of the active patterns;
   a spacer layer formed on the upper surfaces of the active patterns and sidewalls of the isolating layer patterns;
   a first gate structure formed on the active patterns in the cell region, the first gate structure having a lower portion in recesses that are formed at the active patterns;
   a second gate structure formed on the active patterns in the peripheral region, the second gate structure having a flat structure;
   epitaxial layers formed in the active patterns in the cell region and the peripheral region having the first gate structure, the second gate structure and the spacer; and
   a channel region and a well region in the active patterns,
   wherein the substrate comprises a cell region and a peripheral region and wherein and an interval between the active patterns in the cell region is narrower than that between the active patterns in the peripheral region.

* * * * *